United States Patent
Spijker et al.

(10) Patent No.: US 12,381,566 B2
(45) Date of Patent: Aug. 5, 2025

(54) CROSS-COUPLED TIMING SYNCHRONIZATION PLATFORM

(71) Applicant: Renesas Electronics America Inc., Milpitas, CA (US)

(72) Inventors: Menno Spijker, Richmond Hill (CA); Michael Rupert, Richmond Hill (CA); Veronique Allard, Richmond Hill (CA); Ketsana Souksanh, Richmond Hill (CA)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 18/396,825

(22) Filed: Dec. 27, 2023

(65) Prior Publication Data

US 2025/0219645 A1    Jul. 3, 2025

(51) Int. Cl.
*H03L 7/197* (2006.01)
*H03L 7/195* (2006.01)

(52) U.S. Cl.
CPC .......... *H03L 7/1976* (2013.01); *H03L 7/195* (2013.01)

(58) Field of Classification Search
CPC ......... H03L 7/1976; H03L 7/087; H03L 7/07; H03L 7/1075; H03L 7/23; H03L 7/085; H03L 7/093; H03L 7/0994; H03L 7/04; H03L 7/0807; H03L 7/081; H03L 7/0816; H03L 7/0895; H03L 7/091; H03L 7/1072; H03L 7/187; H03L 2207/50; H03L 7/089; H03L 7/099; H03L 7/0991; H03L 7/197; H03L 7/1974; G06F 1/12; G06F 2205/061; G06F 5/06; G06F 5/12; H04L 7/0331; H04L 27/2657; H04L 27/2656; H04L 7/033; H04L 7/0008; H04L 7/0337; H04L 27/2662; H04L 27/2675; H04L 7/0016; H04L 7/005; H04L 25/0398; H04L 27/0014; H04L 27/2695; H04L 7/02; H04L 2027/0016; H04L 25/00; H04L 7/0079; H04L 7/0087; H04L 7/048; H04L 7/0037; H04L 2027/0067; H04L 7/0054;
(Continued)

(56) References Cited

U.S. PATENT DOCUMENTS 10,917,097 B1 * 2/2021 Meyer ...................... H03L 7/07
2012/0313676 A1 * 12/2012 Nguyen .................... H03L 7/23
   327/156
(Continued)

*Primary Examiner* — John W Poos
(74) *Attorney, Agent, or Firm* — SCULLY, SCOTT, MURPHY & PRESSER, P.C.

(57) ABSTRACT

Apparatuses, devices, and systems for time synchronization are described. A timing circuit can include an analog phase lock loop (APLL), a plurality of digital phase lock loops (DPLLs) and a plurality of fractional output dividers (FODs). The timing circuit can receive the plurality of reference clock signals. The timing circuit can use the plurality of reference clock signals to generate at least one fractional frequency offset signal. The timing circuit can apply at least one operand on the at least one fractional frequency offset signal. The timing circuit can sum results of the application of the at least one operand on the at least one fractional frequency offset signal to generate a plurality of signals that control frequencies of a plurality of output clock signals that can be synchronized with the plurality of reference clock signals.

20 Claims, 7 Drawing Sheets

(58) Field of Classification Search
CPC ....... H04L 27/04; H04L 27/12; H04L 27/361; H04L 27/368; H04L 7/00; H04L 7/0091; H04L 7/06; H04L 2027/0057; H04L 2027/0069; H04L 25/05; H04L 43/50; H04L 27/14; H04L 27/22; H04L 27/2647; H04L 7/0083; H04L 1/24; H04L 2027/0026; H04L 2027/0036; H04L 2027/0059; H04L 2027/0065; H04L 27/0002; H04L 27/2601; H04L 12/422; H04L 27/2655; H04L 27/266; H04L 27/2671; H04L 27/2685; H04L 27/2688; H04L 69/324; H04L 7/0012; H04B 1/16; H04B 1/40; H04B 1/123; H04B 1/44; H04B 1/30; H04B 1/403; H04B 14/026; H04B 1/0028; H04B 1/005; H04B 1/04; H04B 1/401

See application file for complete search history.

(56) References Cited

U.S. PATENT DOCUMENTS

| | | | |
|---|---|---|---|
| 2014/0254735 A1* | 9/2014 | Nemawarkar | H04J 3/0697 375/376 |
| 2018/0159541 A1* | 6/2018 | Spijker | H03L 7/0991 |
| 2018/0159542 A1* | 6/2018 | Spijker | H03L 7/0991 |
| 2019/0288695 A1* | 9/2019 | Yao | H03L 7/235 |

* cited by examiner

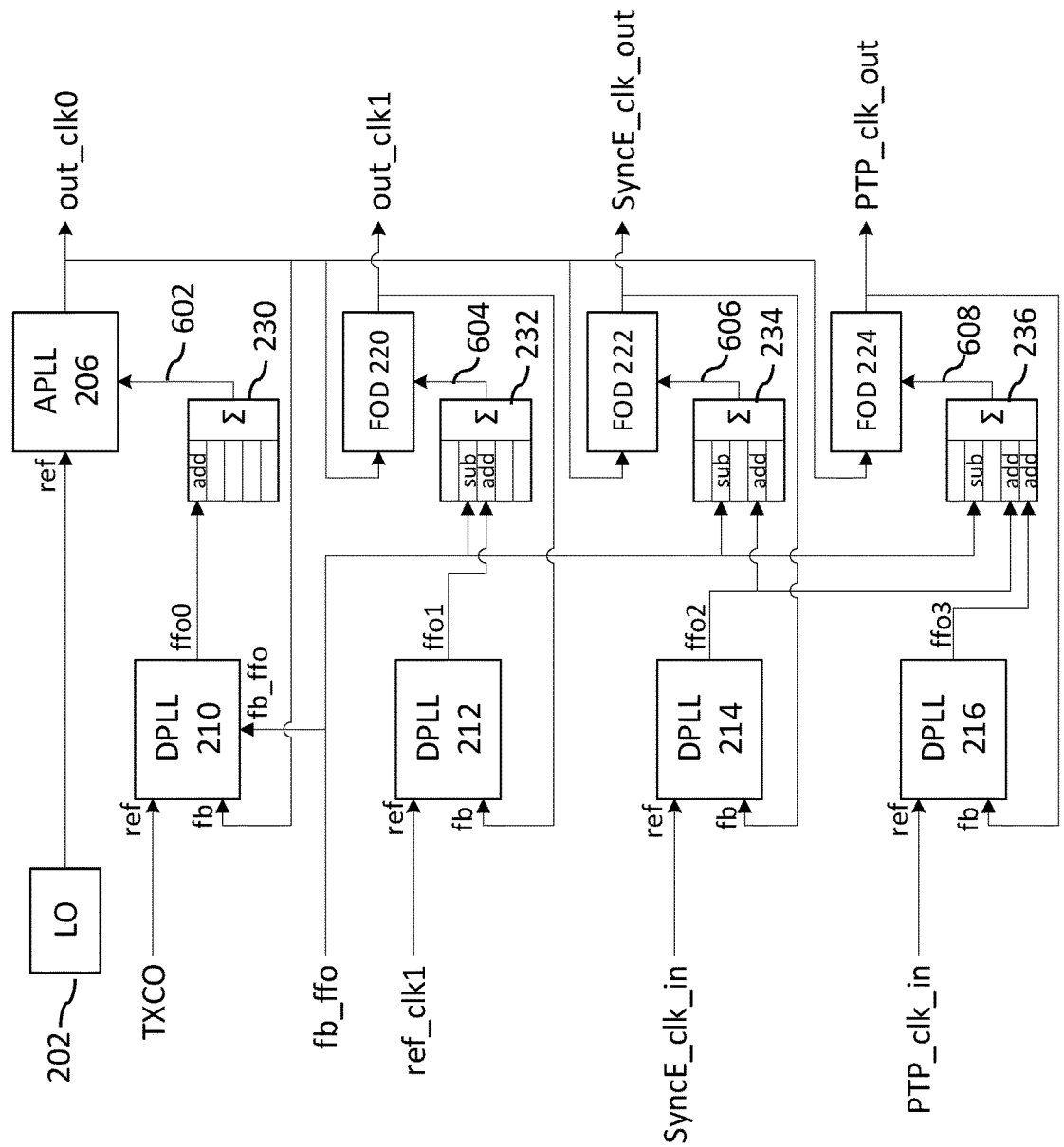

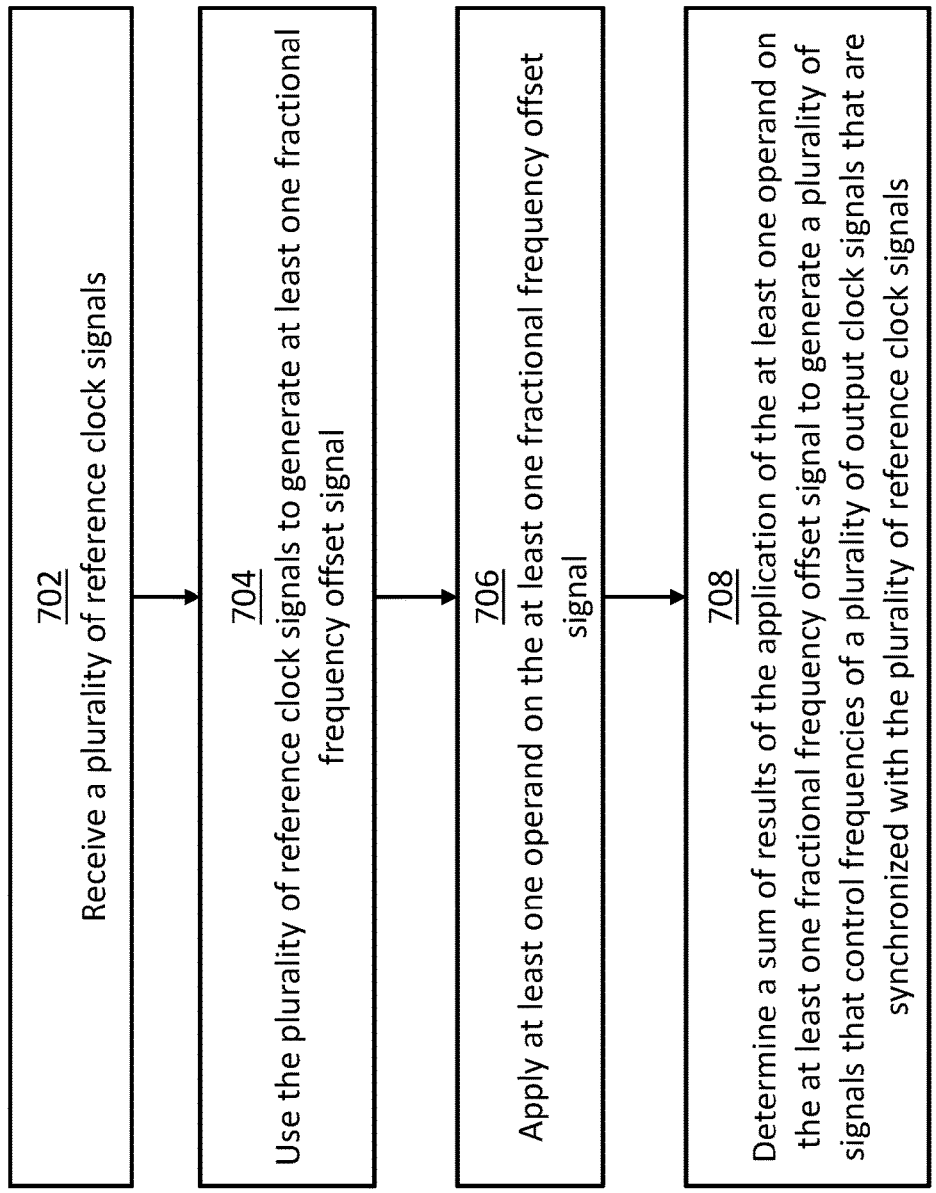

CROSS-COUPLED TIMING SYNCHRONIZATION PLATFORM

BACKGROUND

The present disclosure relates in general to integrated circuit devices and, more particularly, to clock synchronization circuits with cross-coupled network for generating multiple clock signals for synchronization.

A timing circuit including transceivers and clock circuits can be connected to multiple networks to synchronize the multiple networks. The timing circuit can include multiple phase-locked loops, such as analog phase-locked loops (APLL) and digital phase-locked loops (DPLL). An APLL can include an analog phase detector, charge pump, loop filter, and voltage-controlled oscillator (VCO) in a feedback loop. A DPLL can include a digital phase detector and loop filter, and a digital controlled oscillator (DCO). Digital phase-locked loops are typically smaller than analog PLLs, due to the inclusion of digital phase detector & loop filter. A combination of APLL and DPLL can form a mixed signal phase-locked loop that reduces jitter in signals being outputted by the timing circuit.

SUMMARY

In one embodiment, a semiconductor device for timing synchronization is generally described. The semiconductor device can include a first timing channel formed by an analog phase lock loop (APLL), a first digital phase lock loop (DPLL) and a first summation module. The semiconductor device can further include a second timing channel formed by a fractional output divider (FOD), a second digital phase lock loop (DPLL) and a second summation module. The first summation module can be configured to apply at least one operand on one or more of a first fractional frequency offset signal being outputted by the first DPLL and a second fractional frequency offset signal being outputted by the second DPLL. The first summation module can be further configured to sum results of the application of the at least one operand by the first summation module to generate a first signal that controls a frequency of a first clock signal being outputted by the APLL. The second summation module is configured to apply the at least one operand on one or more of the first fractional frequency offset signal being outputted by the first DPLL and the second fractional frequency offset signal being outputted by the second DPLL. The second summation module is further configured to sum results of the application of the at least one operand by the second summation module to generate a second signal that controls a frequency of a second clock signal being outputted by the FOD.

In one embodiment, a system for time synchronization is generally described. The system can include a first set of transceivers configured to receive input data and output a plurality of reference clock signals. The system can further include a second set of transceivers configured to receive a plurality of output clock signals and output a set of synchronized data. The system can further include a timing circuit comprising at least an analog phase lock loop (APLL), a plurality of digital phase lock loops (DPLLs) and a plurality of fractional output dividers (FODs). The timing circuit can be configured to receive the plurality of reference clock signals. The timing circuit can be further configured to use the plurality of reference clock signals to generate at least one fractional frequency offset signal. The timing circuit can be further configured to apply at least one operand on the at least one fractional frequency offset signal. The timing circuit can be further configured to sum results of the application of the at least one operand on the at least one fractional frequency offset signal to generate a plurality of signals that control frequencies of the plurality of output clock signals. The timing circuit can be further configured to send the plurality of signals to the second set of transceivers.

In one embodiment, a method for operating a timing circuit is generally described. The method can include receiving a plurality of reference clock signals. The method can further include using the plurality of reference clock signals to generate at least one fractional frequency offset signal. The method can further include applying at least one operand on the at least one fractional frequency offset signal. The method can further include determining a sum of results of the application of the at least one operand on the at least one fractional frequency offset signal to generate a plurality of signals that control frequencies of a plurality of output clock signals that are synchronized with the plurality of reference clock signals.

Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 6 is a diagram showing another example implementation of cross-coupled timing synchronization platform in one embodiment.

FIG. 7 is a flow diagram illustrating a process to implement cross-coupled timing synchronization platform in one embodiment.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
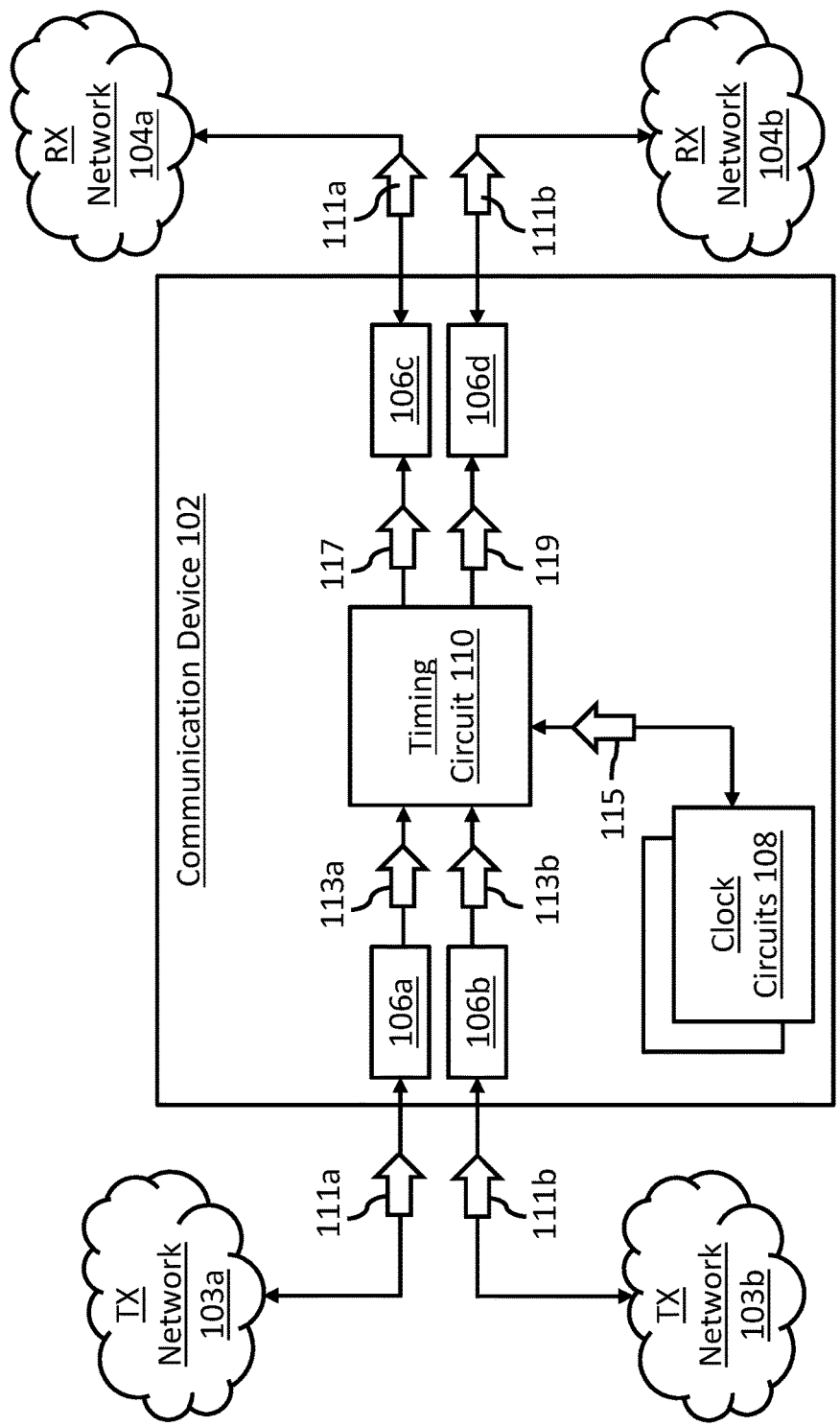
FIG. 1 is a diagram showing an example system for cross-coupled timing synchronization platform in one embodiment.

FIG. 1 is a diagram showing an example system for cross-coupled timing synchronization platform in one embodiment. System 100 can include a communication device 102 and a plurality of networks, such as networks 103*a*, 103*b*, 104*a*, 104*b*. In one embodiment, communication device 102 can be implemented in as a telecommunications network circuit, such as a switch (e.g., Synchronous Ethernet, or SyncE switch) or a router. In one embodiment, system 100 can be implemented to synchronize multiple networks (e.g., two or more networks), such as networks 103a, 103b, 104a, 104b. Networks 103a, 103b, 104a, 104b can be, for example, local area networks (LANs), time division multiplexing (TDM) based networks such as SONET/SDH/PDH, and/or Ethernet-based packet networks.

Communication device 102 can include one or more transceivers 106a, 106b. In one embodiment, transceivers 106a, 106b, 106c, 106d can be Ethernet physical layer transceiver chips. Transceivers 106a, 106b, 106c, 106d can be configured to send or receive data to or from networks 103a, 103b, 104a, 104b, clock circuits 108, and/or timing circuit 110. Communication device 102 can further include at least one clock circuit 108. Clock circuit 108 can be a precision timing protocol (PTP) timing circuit or other timing circuit that can provide reference clock signals. Communication device 102 can further include a timing circuit 110. In one embodiment, timing circuit 110 can be a network card. Although the example in FIG. 1 shows four networks, four transceivers, and one clock circuit, but communication device 102 can include arbitrary number of networks, transceivers, and clock circuits.

In one embodiment, transceivers 106a, 106b, 106c, 106d, clock circuit 108, and timing circuit 110 can be deployed throughout a telecommunications network, in a server rack, or other types of communication devices and networks. In one embodiment, system 100 can be implemented as a single semiconductor integrated circuit (or semiconductor package or device). In another embodiment, transceivers 106a, 106b, 106c, 106d, clock circuit 108, and timing circuit 110, can be implemented as individual semiconductor IC on a printed circuit board.

Transceiver 106a can be coupled to network 103a, and can be configured to send and/or receive signals to and/or from network 103a. Transceiver 106a can be further configured to communicate signals to and from clock circuit 108 and timing circuit 110. Transceiver 106b can be coupled to network 103b, and can be configured to send and/or receive signals to and/or from network 103b. Transceiver 106b can be further configured to communicate signals to and from clock circuit 108 and timing circuit 110. Transceiver 106c can be coupled to network 104a, and can be configured to send and/or receive signals to and/or from network 104a. Transceiver 106c can be further configured to communicate signals to and from clock circuit 108 and timing circuit 110. Transceiver 106d can be coupled to network 104b, and can be configured to send and/or receive signals to and/or from network 104b. Transceiver 106d can be further configured to communicate signals to and from clock circuit 108 and timing circuit 110.

In one embodiment, clock circuit 108 can implement IEEE 1588 compliant packet based timing scheme. Each one of the at least one clock circuit 108 can be configured as a master clock or a slave clock. Clock circuit 108, when implemented as a master clock, can send sync messages to other clock circuits that are being implemented as a slave clock.

In one embodiment, networks 103a, 103b can be transmitting networks and networks 104a, 104b can be receiving networks such that data 111a, 111b can be transmitted from networks 103a, 103b to networks 1104a, 104b via communication device 102, respectively. When networks 103a, 103b are transmitting networks, transceivers 106a, 106b can recover respective physical reference clock signals 113a, 113b from data 111a, 111b, respectively. In one embodiment, recovered physical reference clock signals 113a, 113b can be SyncE physical clock signals. Transceivers 106a, 106b can send recovered physical reference clock signals 113a, 113b to timing circuit 110. Clock circuit 108, when implemented as a slave clock, can send a reference signal 115 to timing circuit 110. Reference signal 115 can be digital information, such as an internal reference clock's PTP phase clock signal. Timing circuit 110 can generate an output clock signal 117 that is frequency and/or phase locked with physical reference clock signal 113a, and an output clock signal 119 that is frequency and/or phase-locked with physical reference clock signal 113b. Timing circuit 110 can send output clock signals 117, 119 to transceiver 106b and clock circuit 108b, respectively, such that timing circuit 110 can send data 111a, 111b to networks 104a, 104b under synchronized frequency and phase. In one embodiment, timing circuit 110 can also generate output clock signals that is frequency and/or phase locked with reference signal 115.

Timing circuit 110 can include multiple analog phase-locked loops (APLL) and digital phased-lock loops (DPLL) configured to generate frequency locked and/or phase locked signals. A combination of APLLs and DPLLs can form a mixed signal phase-locked loop (PLL) that reduces jitter at the output of timing circuit 110. Timing circuit 110 can further include fractional output dividers (FOD) to use fixed fractional divide ratios to divide high frequency clocks that are being generated by the combination of the APLLs and DPLLs. In an aspect, each DPLL can be connected to an APLL or a FOD to generate a clock signal for a timing channel. Hence, if there are N DPLLs, then timing circuit 110 can have N timing channels. However, once the N timing channels are configured for specific timing applications, the configurations may be kept unchanged since changes to the configuration may disrupt output clock signals 117, 119.

To be described in more detail below, in addition to multiple DPLLs (e.g., two or more), an APLL and FODs, timing circuit 110 can further include a configurable cross-coupling network including summation modules that can adjust fractional frequency offset (ffo) signals being outputted by the DPLLs. Each one of the multiple DPLLs in timing circuit 110 can be connected to a dedicated summation module that can apply one or more user programmable operands to the fractional frequency offset signals being outputted by the DPLLs. Further, the configuration of operands and the enabling or disabling of DPLLs can be performed dynamically (e.g., at any time, even during operation). By selectively configuring the operands and enabling or disabling the DPLLs in timing circuit, different output clock signals generated by timing circuit 110 can be applied to a wide range of timing applications.

Figure 2:
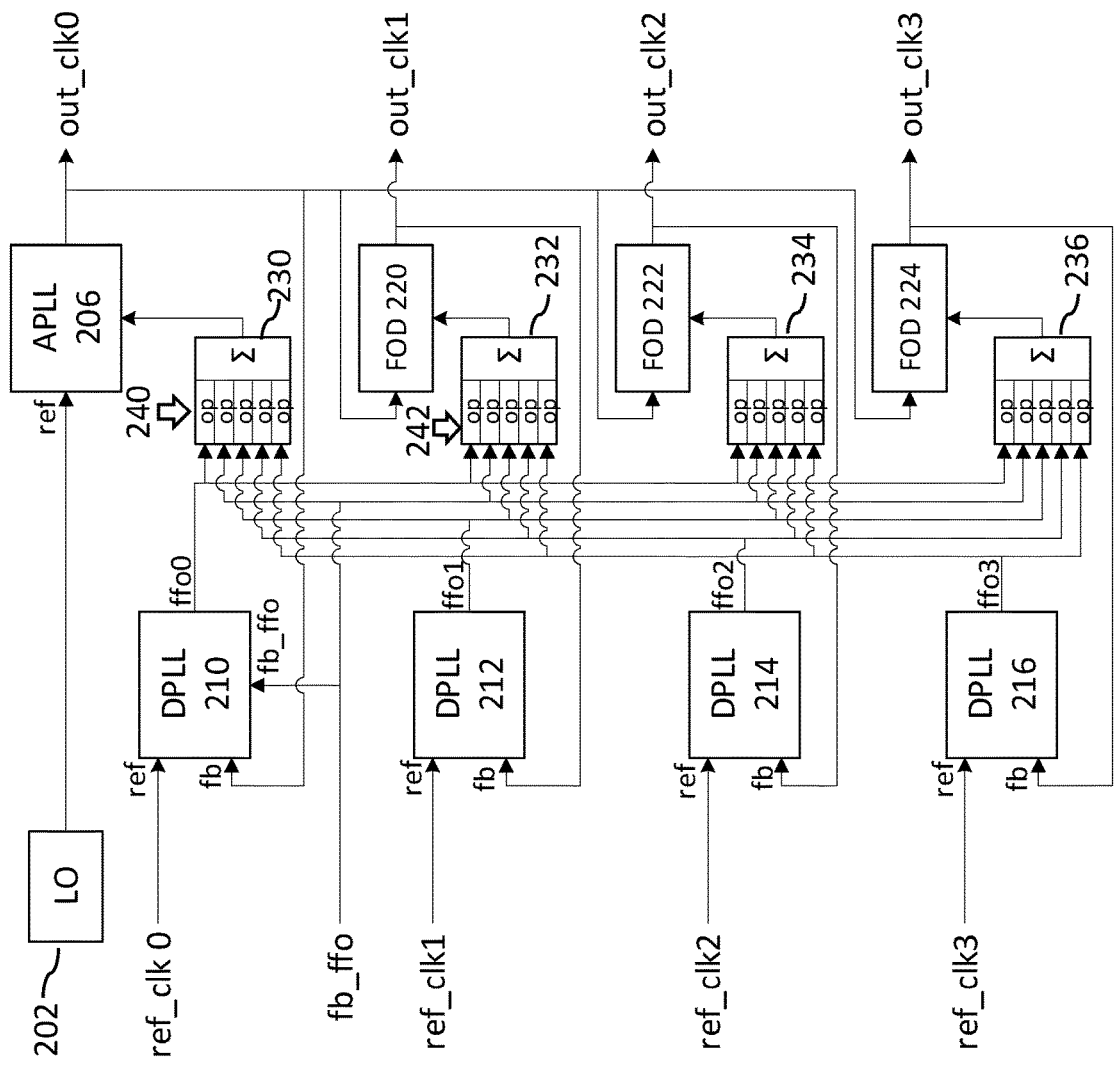
FIG. 2 is a diagram showing a timing circuit that can implement cross-coupled timing synchronization platform in one embodiment.

FIG. 2 is a diagram showing a timing circuit that can implement cross-coupled timing synchronization platform in one embodiment. Descriptions of FIG. 2 can reference components shown in FIG. 1. Details of timing circuit 110 are shown in FIG. 2. Timing circuit 110 can include an APLL, N DPLLs, N summation modules, and N−1 FODs. One specific DPLL can be connected to APLL 206, and the rest of N−1 DPLLs can be connected to a dedicated FOD among the N−1 FODs. One summation module can be connected to between the specific DPLL and the APLL, and the rest of N−1 summation modules can be connected to the N−1 FODs. The APLL or the N−1 FODs can function as digital controlled oscillators for the N DPLLs. In the embodiment shown in FIG. 2, N=4 and timing circuit 110 can include a local oscillator (LO) 202, an APLL 206, a plurality of DPLLs 210, 212, 214, 216, a plurality of FODs 220, 222, 224 and a plurality of summation modules 230, 232, 234, 236. In one embodiment, LO 202 can be a crystal oscillator. In one embodiment, summation modules 230, 232, 234, 236 can be summation circuits. The physical reference clock signals 113a, 113b in FIG. 1 can be among reference clock signals ref_clk0, ref_clk1, ref_clk2, ref_clk3 shown in FIG. 2. The output clock signals 117, 119 in FIG. 1 can be among the output clock signals out_clk0, out_clk1, out_clk2, out_clk3 shown in FIG. 2. In the embodiment shown in FIG. 2, DPLL 210 and APLL 206 can form a first timing channel. DPLL 212 and FOD 220 can form a second timing channel. DPLL 214 and FOD 222 can form a third timing channel. DPLL 216 and FOD 224 can form a fourth timing channel.

DPLL 210 can be connected to APLL 206 and a dedicated summation module 230. Initially, APLL 206 can lock to (e.g., synchronized with) the LO signal outputted by LO 202 and generates an output clock signal out_clk0 with the same fractional frequency offset as the LO 202 prior to locking by DPLL 210 (e.g., before DPLL 210 received a first feedback out_clk0). The output clock signal out_clk0 can be fed back to DPLL 210. DPLL 210 can receive clock ref_clk0 and generates a ffo0 signal ("ffo0") for APLL 206. The ffo0 signal can be a fractional frequency offset to steer APLL 210, and ffo0 can indicate a parts per million (ppm) value (which indicated a relatively small percentage) to adjust out_clk0. APLL 206 can use ffo0 to adjust out_clk0 such that out_clk0 can be frequency or phase locked with reference clock ref_clk0. The output clock signal out_clk0 can be fed back to DPLL 210 continuously to implement a feedback loop to keep out_clk0 frequency or phase locked with ref_clk0. In one embodiment, DPLL 210 can be configured to compare out_clk0 with ref_clk0 to determine differences (e.g., phase, frequency difference) between out_clk0 with ref_clk0, and the differences can be filtered by DPLL 210 to generate ffo0 signal that may remove any undesired frequencies. Further, output clock signal out_clk0 can be distributed to FODs 220, 222, 224 such that FODs 220, 222, 224 can follow the output clock signal out_clk0. FODs 220, 222, 224 can be configured to divide high frequency clocks generated by APLL 206 and the DPLLs in timing circuit 110 using constant fractional divide ratios.

DPLL 212 can be connected to FOD 220 and a dedicated summation module 232. FOD 220 can output an output clock signal out_clk1 that follows the output clock signal out_clk0 distributed by APLL 206. The output clock signal out_clk1 can be fed back to DPLL 212. DPLL 212 can receive a reference clock ref_clk1 and generate a fractional frequency offset signal ("ffo1") for FOD 220. The ffo1 signal can be a fractional frequency offset to steer FOD 220, and ffo1 can indicate a parts per million (ppm) value (which indicated a relatively small percentage) to adjust out_clk1. FOD 220 can use ffo1 to generate out_clk1 that is frequency or phase locked with reference clock ref_clk1. The output clock signal out_clk1 can be fed back to DPLL 212 continuously to implement a feedback loop to keep out_clk1 frequency or phase locked with ref_clk1. In one embodiment, DPLL 212 can be configured to compare out_clk1 with ref_clk1 to determine differences (e.g., phase, frequency difference) between out_clk1 with ref_clk1, and the differences can be filtered by DPLL 212 to generate ffo1 signal that may remove any undesired frequencies. DPLLs 214, 216 can operate in the same manner as DPLL 212, and FODs 222, 224 can operate in the same manner as FOD 220.

Summation module 230 can receive the ffo0 signal outputted from DPLL 210 and can receive operands 240. Summation module 230 can apply operands 240 on the ffo0 signal outputted from DPLL 210. In one embodiment, operands 240 can include add, subtract, or block. The add operand can add the ppm value indicated by ffo0 to out_clk0. The subtract operand can subtract the ppm value indicated by ffo0 from out_clk0. The block operand can maintain out_clk0 (e.g., no changes). Summation module 230 can output a result of the application of operands 240 on the ffo0 signal being outputted from DPLL 210 to APLL 206. Similar to summation module 230, summation module 232 can receive the ffo1 signal outputted from DPLL 212 and can receive operands 242. Summation module 232 can apply operands 242 on the ffo1 signal outputted from DPLL 212. In one embodiment, operands 242 can include add, subtract, or block. Summation module 232 can output a result of the application of operands 242 on the ffo1 signal being outputted from DPLL 212 to FOD 220.

Operands 240, 242 can be programmable by a user of system 100. Further, DPLLs in timing circuit 110 can be selectively enabled or disabled by the user of system 100. The configuration of operands and selective enable or disable of DPLLs can allow system 100 to output different clock signals tailored for different timing applications. By way of example, the combination of DPLL 210 and APLL 206, and combinations of other DPLLs and FODs, can form independent timing channels. In one embodiments, the operands being provided to summation modules 230, 232, 234, 236 can be received from user interface running on a computing device.

In one embodiment, a feedback fractional frequency offset (fb_ffo) signal can be provided to one or more of the DPLLs in timing circuit 110. The fb_ffo signal can indicate a fractional frequency offset, such as a ppm value. In the example shown in FIG. 2, the fb_ffo signal is being provided to DPLL 210 and to summation module 230. When the fb_ffo signal is being provided to DPLL 210, the fb_ffo signal can control the ffo0 signal being outputted from DPLL 210. The ffo0 signal being outputted from DPLL 210 can be a sum of the fractional frequency offset of ref_clk0 and the fractional frequency offset indicated by the fb_ffo. By way of example, if ref_clk0 is a clock signal with +10 ppm and fb_ffo indicates −30 ppm, then ffo0 can be −20 ppm.

The fb_ffo signal can also be provided to the summation modules 230, 232, 234, 236, such that the ppm value indicated by the fb_ffo signal can be added, subtract, or blocked (e.g., no changes to ffo0) to the ffo0 signal being outputted by corresponding DPLLs. The fb_ffo signal can provide an additional source (e.g., in addition to the ffo signals outputted by the DPLLs) to control the frequency of output clock signals by APLL 206 or the FODs in timing circuit 110. Further, the fb_ffo signal can be dynamically configurable by user during operations of timing circuit 110.

Figure 3:
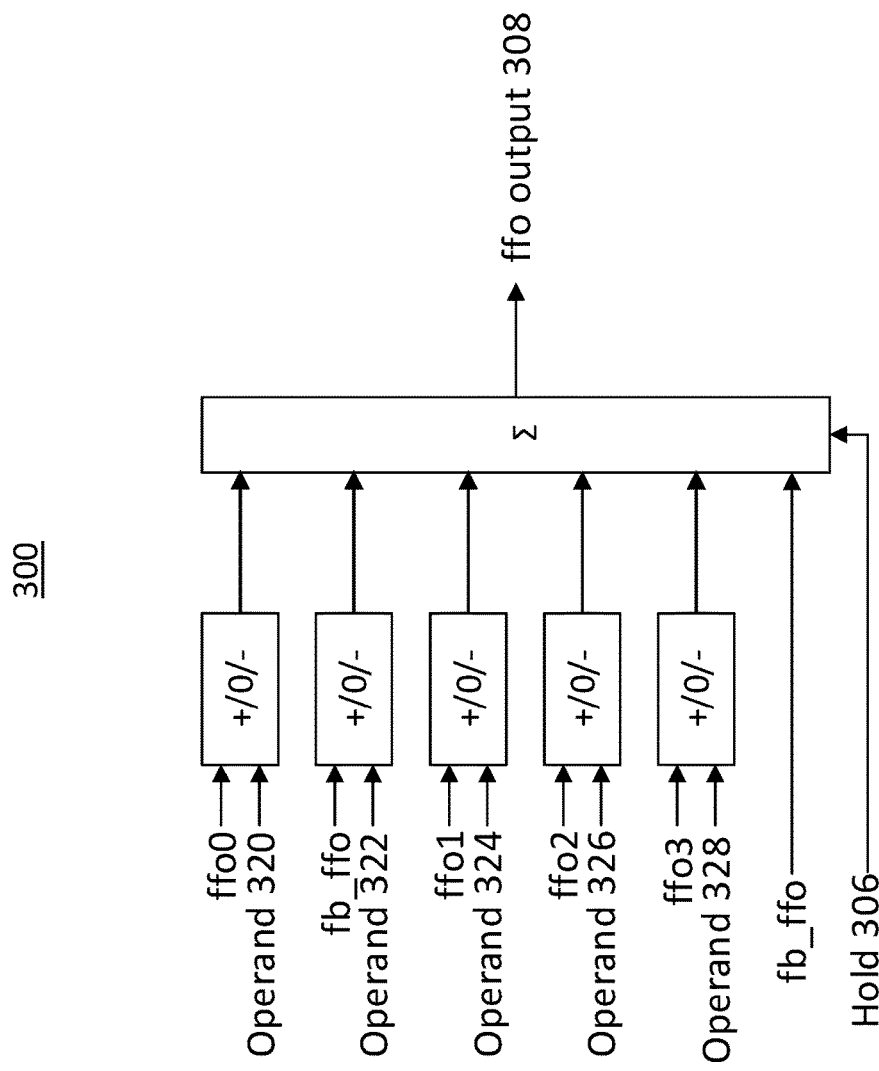
FIG. 3 is a diagram showing a summation module that can implement cross-coupled timing synchronization platform in one embodiment.

FIG. 3 is a diagram showing a summation module that can implement cross-coupled timing synchronization platform in one embodiment. Descriptions of FIG. 3 can reference components shown in FIG. 1 to FIG. 2. An example implementation of a summation module 300, which can be one of summation modules 230, 232, 234, 236, is shown in FIG. 3. Summation module 300 can receive one or more fractional frequency offset signals ffo0, ffo1, ffo2, ffo3 from DPLLs 210, 212, 214, 216, respectively. Summation module 300 can also receive the fb_ffo signal. Summation module 300 can also receive different operands 320, 322, 324, 326, 328. Operands 320, 324, 326, 328 can be applied on fractional frequency offset signals ffo0, ffo1, ffo2, ffo3, respectively, and operand 322 can be applied on the fb_ffo signal. The fractional frequency offset signals, including fb_ffo signal, being received at summation module 300 can be inverted (e.g., subtracting), zero-ed (e.g., block or ignore) or passed unaltered (e.g., adding), dependent on the operand that is applied.

The result of the application of the operands can be summated together to generate an ffo output 308. In the embodiment shown in FIG. 3, the fb_ffo signal is also provided to the summation block (with the Σ label) such that the result of the application of the operands can also be summated with the fb_ffo signal to generate fractional frequency offset output (ffo output) 308. The ffo output 308 can be a fractional frequency offset signal indicating a ppm value to control the output clock signal, such as changing the frequency, of APLL 206 or a FOD in timing circuit 110. In one embodiment, summation module 300 can include a set of registers for storing the operands being provided to summation module 300. The operands can be programmable, such as by a user of system 100, and can be provided through a serial port to the set of registers.

In one embodiment, a hold signal 306 can be provided to the summation block to hold a digital word (e.g., a most recent value or voltage level) of ffo output 308 for a specific amount of time. By way of example, when the operands are being dynamically configured during operation of timing circuit 110, one operand can be changed at a time (e.g., operands are changed sequentially). Hold signal 306 can hold the digital word of ffo output 308 during the sequential changes to the operands and until all changes to the operands are completed. In response to completing changes to the operands, the hold being applied by hold signal 306 can be released and summation module 300 can summate a new set of results from the application of new operands to update ffo output 308. Therefore, changes to the fractional frequency offset signals or the operands will not change ffo output 308 prematurely. Also, holding the digital word of ffo output 308 during operand changes can avoid phase and frequency transients on the APLL or FOD output clocks.

Figure 4:
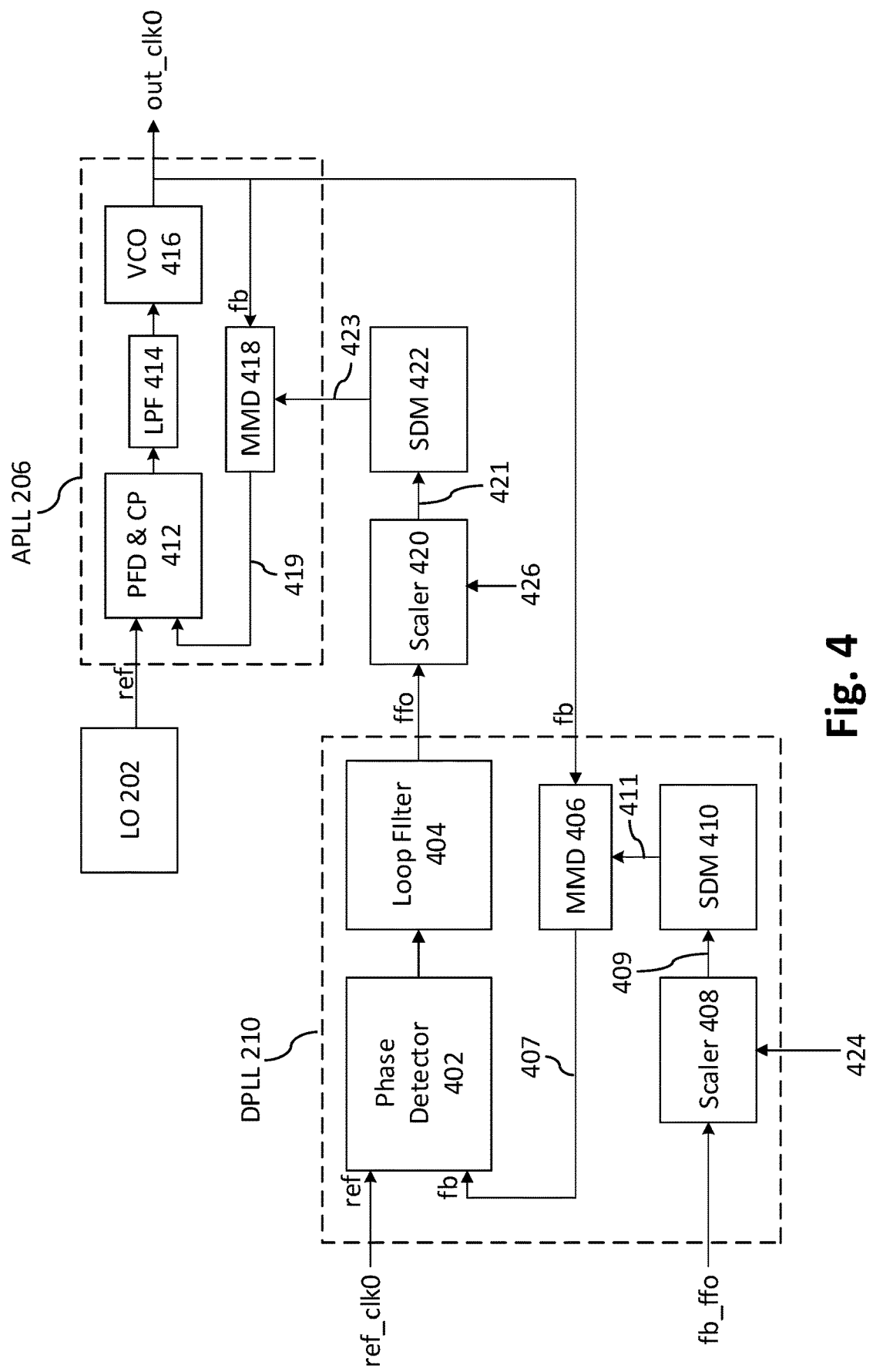
FIG. 4 is a diagram showing components in a cross-coupled timing synchronization platform in one embodiment.

FIG. 4 is a diagram showing components in a cross-coupled timing synchronization platform in one embodiment. Descriptions of FIG. 4 can reference components shown in FIG. 1 to FIG. 3. An example implementation of DPLL 210 and APLL 206, where the fb_ffo signal is being provided to DPLL 210, is shown in FIG. 4. APLL 206 can include a phase frequency detector (PFD) and charge pump (CP) circuit 412, a low pass filter (LPF) 414, a voltage controlled oscillator (VCO 416) and a multi-modulus divider (MMD) 418. A scaler 420 and a sigma delta modulator (SDM) 422 can be connected between DPLL 210 and APLL 206.

DPLL 210 can include a phase detector 402, a loop filter 404, a MMD 406, a scaler 408 and a SDM 410. Scaler 408 can upscale or downscale the nominal fractional divide value to produce a scaled fractional divide value 409. The scaled fractional divide value signal 409 can be inputted to SDM 410. SDM 410 can convert the scaled fractional divide value signal 409 into a digital signal 411 that alternates between two integer values that on average equals the scaled fractional divide value of signal 409. The digital signal 411 can be provided to MMD 406. MMD 406 can divide the feedback signal ("fb"), that is the out_clk0 signal outputted by APLL 206, by the numerical value of digital signal 411 from SDM 410, and the result can be another digital signal 407. Digital signal 407 can be provided as a feedback signal to phase detector 402 in DPLL 210.

Phase detector 402 can determine a phase difference between ref_ckl0 and digital signal 407. The difference can be passed through loop filter 404 to generate a fractional frequency offset signal (e.g., ffo0 in FIG. 2). Loop filter 404 can provide proportional and integral (PI) control on the difference to correct errors. The fractional frequency offset signal generated by DPLL 210 can be provided to scaler 420. Scaler 420 can upscale or downscale the nominal fractional divide value to produce a scaled fractional divide value signal 421. The scaled fractional divide value signal 421 can be inputted to SDM 422. SDM 422 can convert the scaled fractional divide value signal 421 into a digital signal 423 that alternates between two integer values that on average equals the scaled fractional divide value of signal 421. The digital signal 423 can be provided to MMD 418. MMD 418 can divide the feedback signal ("fb"), that is the out_clk0 signal outputted by APLL 206, by the numerical value of digital signal 423 from SDM 422, and the result can be another digital signal 419. Digital signal 419 can be provided to PFD and CP circuit 412. Nominal fractional divide values 424 for the DPLL 210 can be input to scaler 408. Nominal fractional divide values 426 for the APLL 206 can be input to scaler 420.

Focusing on APLL 206, PFD and CP circuit 412 can determine a phase and frequency difference between the reference clock signal received from LO 202 and digital signal 419. The phase and frequency difference can be passed through LPF 414 then into VCO 416 for adjusting and/or generating output clock signal out_clk0. The output clock signal out_clk0 can be fed back to DPLL 210. By using scaler 408 and SDM 410 to process the fb_ffo signal, the fractional divide ratio of MMD 406 can be variable instead of being constant. Since the fb_ffo signal is programmable dynamically during operations of timing circuit 110, the frequency of output clock signal out_clk0 can be controlled by the programmable fb_ffo signal instead of being solely controlled based on ref_clk0.

Figure 5:
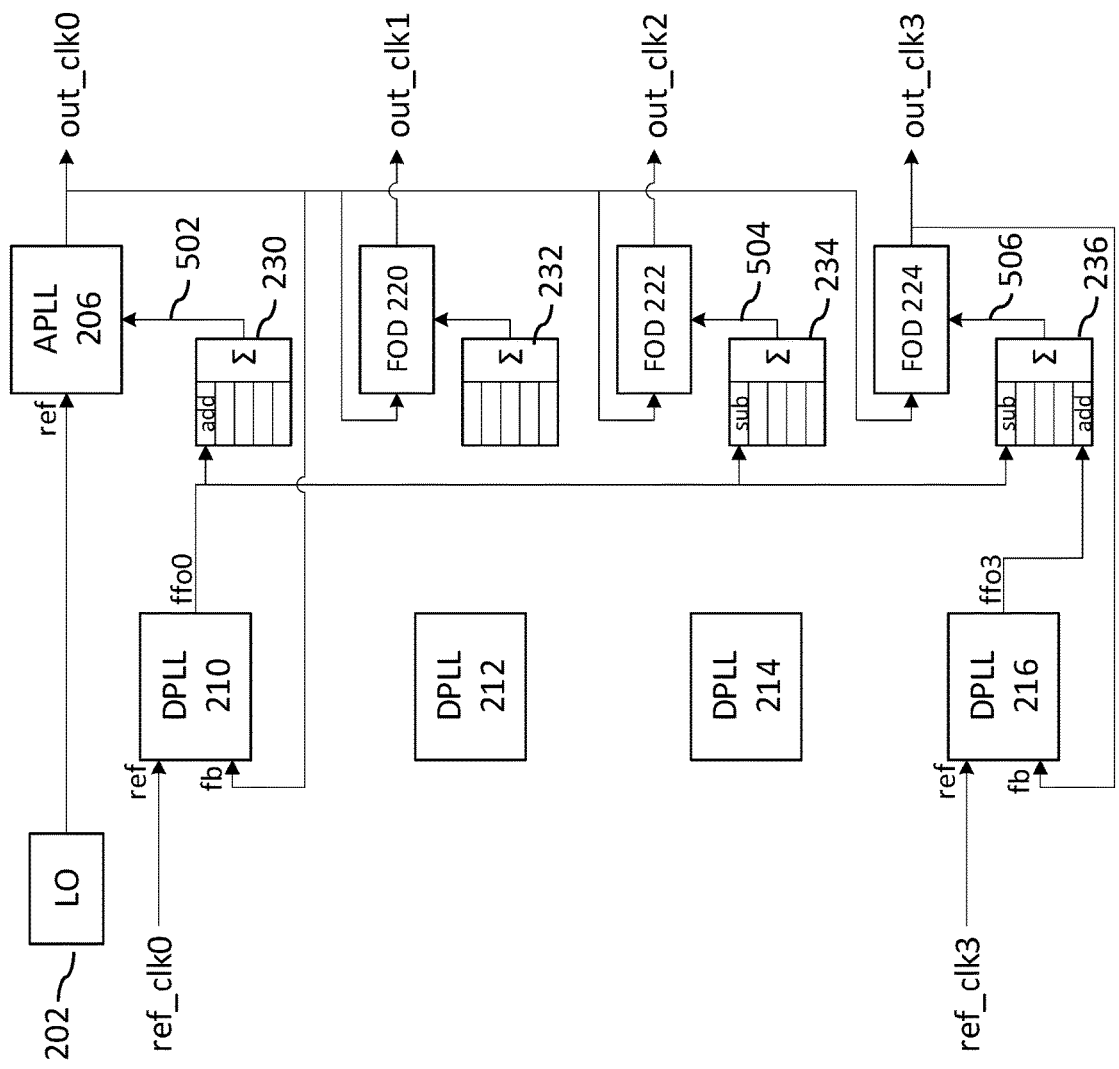
FIG. 5 is a diagram showing an example application of cross-coupled timing synchronization platform in one embodiment.

FIG. 5 is a diagram showing an example application of cross-coupled timing synchronization platform in one embodiment. Descriptions of FIG. 5 can reference components shown in FIG. 1 to FIG. 4. An example application of timing circuit 110 is shown in FIG. 5. In FIG. 5, DPLLs 212, 214 are disabled and DPLLs 210, 216 are enabled. When DPLLs 212, 214 are disabled, the ffo1 and ffo2 signals are unavailable or inaccessible to the summation modules. DPLL 210 can be locked to, or synchronized with, ref_clk0. Summation module 230 can receive the ffo0 signal from DPLL 210 and apply an "add" operand to the ffo0 signal to produce a signal 502 to drive APLL 206. The signal 502 can be a sum resulting from summation module 230. In the example shown in FIG. 5, since summation module 230 performed an "add" operand on the ffo0 signal and no other operations, signal 502 can indicate a ppm value indicated by the ffo0 signal. The output clock signal out_clk0 from APLL 206 can be locked to, or synchronized with, ref_clk0 since DPLL 210 is locked to ref_clk0 and the only operand applied in summation module 230 was addition of the ffo0 signal, which is also locked to ref_clk0. The output clock signal out_clk0 can be provided to FODs 220, 222 and 224. The operands of the blank boxes in the summation modules shown in FIG. 5 are operands that are set to "block" or "zero-ed".

FOD 220 can divide the APLL clock (out_clk0) by a constant fractional divide ratio such that out_clk1 is also locked to, or synchronized with, ref_clk0. Out_clk1 can remain locked to ref_clk0 as long as summation module 232 does not receive any fractional frequency offset signals. Moving on to summation module 234, summation module 234 can receive ffo0 signal from DPLL 210 and an associated subtraction operand. Summation module 234 can apply a "sub" operand to the ffo0 signal to produce a signal 504 that can be a sum resulting from summation module 234. In the example shown in FIG. 5, since summation module 234 performed a "sub" operand on the ffo0 signal and no other operations, signal 504 can indicate a negative value of the ppm value indicated by the ffo0 signal. The output clock signal out_clk2 from FOD 222 can be locked to LO 202 since ffo0 is removed by FOD 222 according to signal 504.

Moving on to DPLL 216, DPLL 216 can receive an input clock ref_clk3 and output a ffo3 signal that can be locked to ref_clk3. Summation module 236 can receive ffo3 signal from DPLL 216 and an associated subtraction operand, and an addition operand associated with the ffo3 signal from DPLL 216. Summation module 236 can apply a "sub" operand to the ffo0 signal, and apply the "add" operand to the ffo3 signal, to produce a signal 506 that can be a sum of the ppm values indicated by the ffo0 signal and ffo3 signal. Since the "sub" operand was applied on the ffo0 signal, signal 506 can be a result of subtracting the ppm value of ffo0 signal from the ppm value of the ffo3 signal. As a result of removing the ffo0 signal via the subtraction operand, the output clock signal out_clk3 from FOD 224 can be independent from DPLL 210 and can be locked to, or synchronized with, ref_clk3.

FIG. 6 is a diagram showing another example application of cross-coupled timing synchronization platform in one embodiment. Descriptions of FIG. 6 can reference components shown in FIG. 1 to FIG. 5. Another example application of timing circuit 110 is shown in FIG. 6. In the example shown in FIG. 6, LO 202 can be a crystal oscillator and APLL 206 can be initially locked to the crystal oscillator. In an aspect, a crystal oscillator can provide the lowest jitter on the APLL output clock out_clk0. However, the crystal oscillator may not provide good temperature stability. To overcome poor temperature stability, DPLL 210 can be locked to a temperature compensated crystal oscillator (TCXO). A TCXO can provide better temperature stability but the jitter can be worse than the crystal oscillator. However, since DPLL 210 has a much lower bandwidth than APLL 206, the TCXO jitter can be suppressed. The fb_ffo signal can be provided by an external processor through a serial microport, such that the APLL output clock out_clk0 has a fractional frequency offset that is the sum of the TCXO FFO (e.g., ffo0 in this example) and fb_ffo.

In FIG. 6, DPLLs 210, 212, 214, 216 are enabled. DPLL 210 can receive a TXCO input clock. DPLL 210 can also receive the fb_ffo signal that can be multiplied with the feedback of out_clk0 and the product can be compared with the TXCO clock to generate the ffo0 signal. Summation module 230 can receive the ffo0 signal from DPLL 210 and apply an "add" operand to the ffo0 signal to produce a signal 602 to drive APLL 206. The signal 602 can be a sum resulting from summation module 230. In the example shown in FIG. 6, since summation module 230 performed an "add" operand on the ffo0 signal and no other operations, signal 602 can indicate a ppm value indicated by the ffo0 signal. The output clock signal out_clk0 can be provided to FODs 220, 222 and 224. The operands of the blank boxes in the summation modules shown in FIG. 6 are operands that are set to "block" or "zero-ed".

DPLL 212 can receive an input clock ref_clk1 and output a ffo1 signal that can be locked to ref_clk1. Summation module 232 can receive ffo1 signal from DPLL 212 and an associated addition operand. Summation module 232 can also receive the fb_ffo signal and an associated subtraction operand. Summation module 232 can apply a "sub" operand to the fb_ffo signal, and apply the "add" operand to the ffo1 signal, to produce a signal 604 that can be a sum of the ppm values indicated by the fb_ffo signal and the ffo1 signal. Since the "sub" operand was applied on the fb_ffo signal, signal 604 can be a result of subtracting the ppm value of the fb_ffo signal from the ppm value of the ffo1 signal. As a result of removing the fb_ffo signal via the subtraction operand, the output clock signal out_clk1 from FOD 220 can be locked to ref_clk1. Note that by subtracting the fb_ffo signal, a timing channel formed by DPLL 212 and FOD 220 can have the added stability from the TCXO clock (e.g., via the out_clk0 signal) but will not have the modulation from the fb_ffo signal.

In the example shown in FIG. 6, DPLL 214 and DPLL 216 can form a SyncE/PTP pair, where the SyncE fractional frequency offset can be added to the PTP fractional frequency offset for stabilization. Further, both DPLLs 214, 216 can have the added stabilization from the TCXO but will not have the modulation from the fb_ffo signal. DPLL 214 can receive a SyncE clock SyncE_clk_in and output a ffo2 signal that can be locked to SyncE_clk_in. Summation module 234 can receive ffo2 signal from DPLL 214 and an associated addition operand. Summation module 234 can also receive the fb_ffo signal and an associated subtraction operand. Summation module 234 can apply a "sub" operand to the fb_ffo signal, and apply the "add" operand to the ffo2 signal, to produce a signal 606 that can be a sum of the ppm values indicated by the fb_ffo signal and the ffo2 signal. Since the "sub" operand was applied on the fb_ffo signal, signal 606 can be a result of subtracting the ppm value of the fb_ffo signal from the ppm value of the ffo2 signal. As a result of removing the fb_ffo signal via the subtraction operand, the output clock signal SyncE_clk_out from FOD 222 can be locked to SyncE_clk_in.

DPLL 216 can receive a PTP clock PTP_clk_in and output a ffo3 signal that can be locked to PTP_clk_in. Summation module 236 can receive ffo3 signal from DPLL 216 and an associated addition operand. Summation module 236 can also receive ffo2 signal from DPLL 214 and an associated addition operand. Summation module 236 can further receive the fb_ffo signal and an associated subtraction operand. Summation module 236 can apply a "sub" operand to the fb_ffo signal, apply the "add" operand to the ffo2 signal, and apply the "add" operand to the ffo3 signal to produce a signal 608 that can be a sum of the ppm values indicated by the fb_ffo signal, the ffo2 signal and the ffo3 signal. Since the "sub" operand was applied on the fb_ffo signal, signal 608 can be a result of subtracting the ppm value of the fb_ffo signal from a sum of the ppm values of the ffo2 and ffo3 signals. As a result of removing the fb_ffo signal via the subtraction operand, the output clock signal PTP_clk_out from FOD 224 can be locked to PTP_clk_in.

FIG. 7 is a flow diagram illustrating a process to implement cross-coupled timing synchronization platform in one embodiment. Process 700 can include one or more operations, actions, or functions as illustrated by one or more of blocks 702, 704, 706 and/or 708. Although illustrated as discrete blocks, various blocks can be divided into additional blocks, combined into fewer blocks, eliminated, performed in different order, or performed in parallel, depending on the desired implementation.

Process 700 can be performed by a timing circuit, such as timing circuit 110 described herein. Process 700 can begin at block 702. At block 702, the timing circuit can receive a plurality of reference clock signals. Process 700 can proceed from block 702 to block 704. At block 704, the timing circuit can use the plurality of reference clock signals to generate at least one fractional frequency offset signal.

Process 700 can proceed from block 704 to block 706. At block 706, the timing circuit can apply at least one operand on the at least one fractional frequency offset signal. In one embodiment, the at least one operand can include an addition operand, a subtraction operand and a block operand. In one embodiment, the timing circuit can multiply a feedback fractional frequency offset signal with feedback of at least one of the plurality of output clock signals to generate the at least one fractional frequency offset signal. In one embodiment, the timing circuit can apply the at least one operand on fractional frequency offset signals generated by a set of digital phase lock loops (DPLLs) that are enabled in a timing circuit.

Process 700 can proceed from block 706 to block 708. At block 708, the timing circuit can determine a sum of results of the application of the at least one operand on the at least one fractional frequency offset signal to generate a plurality of signals that control frequencies of a plurality of output clock signals that are synchronized with the plurality of reference clock signals. In one embodiment, the timing circuit can apply the at least one operand on a feedback fractional frequency offset signal and determine a sum of a result of the application of the at least one operand on the feedback fractional frequency offset signal with the sum of the results of the application of the at least one operand on the at least one fractional frequency offset signal to generate the plurality of signals.

In one embodiment, the timing circuit can hold the plurality of signals at constant voltage levels. The timing circuit can receive an update to the at least one operand. The timing circuit can apply the at least one updated operand on the at least one fractional frequency offset signal. The timing circuit can release the hold of the plurality of signals.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
a first timing channel formed by an analog phase lock loop (APLL), a first digital phase lock loop (DPLL) and a first summation module; and
a second timing channel formed by a fractional output divider (FOD), a second digital phase lock loop (DPLL) and a second summation module, wherein:
the first summation module is configured to:
apply at least one operand on one or more of:
a first fractional frequency offset signal being outputted by the first DPLL, wherein the first fractional frequency offset signal is based on a feedback fractional frequency offset signal and a feedback of a first clock signal being outputted by the APLL, and the feedback fractional frequency offset signal is variable; and
a second fractional frequency offset signal being outputted by the second DPLL; and
sum results of the application of the at least one operand by the first summation module to generate a first signal that controls a frequency of the first clock signal being outputted by the APLL; and
the second summation module is configured to:
apply the at least one operand on one or more of:
the first fractional frequency offset signal being outputted by the first DPLL; and
the second fractional frequency offset signal being outputted by the second DPLL; and
sum results of the application of the at least one operand by the second summation module to generate a second signal that controls a frequency of a second clock signal being outputted by the FOD.

2. The semiconductor device of claim 1, wherein the first summation module is further configured to:
apply the at least one operand on a feedback fractional frequency offset signal, wherein the sum of the results of the application of the at least one operand comprises a result of the application of the at least one operand on the feedback fractional frequency offset signal.

3. The semiconductor device of claim 1, wherein the first DPLL is configured to:
multiply the feedback fractional frequency offset signal with the feedback of the first clock signal being outputted by the APLL to generate a digital signal, wherein the feedback fractional frequency offset signal is variable;
determine a difference between the digital signal and an input clock signal; and use the difference to generate the first fractional frequency offset signal.

4. The semiconductor device of claim 1, wherein the at least one operand comprises:
   an addition operand;
   a subtraction operand; and
   a block operand.

5. The semiconductor device of claim 1, wherein the second DPLL is disabled, in response to the second DPLL being disabled:
   the second fractional frequency offset signal is inaccessible by the first summation module; and
   the first summation module is configured to apply the at least one operand on the first fractional frequency offset signal being outputted by the first DPLL.

6. The semiconductor device of claim 1, wherein the first summation module is configured to:
   hold the first signal at a constant voltage level;
   receive an update to the at least one operand;
   apply the at least one updated operand on one or more of:
      the first fractional frequency offset signal being outputted by the first DPLL; and
      the second fractional frequency offset signal being outputted by the second DPLL; and
   release the hold of the first signal.

7. The semiconductor device of claim 1, further comprising:
   a third timing channel formed by another FOD, a second DPLL and a third summation module, wherein the third summation module is configured to:
      apply the at least one operand on one or more of:
         the first fractional frequency offset signal being outputted by the first DPLL;
         the second fractional frequency offset signal being outputted by the second DPLL; and
         a third fractional frequency offset signal being outputted by the third DPLL; and
      sum results of the application of the at least one operand by the third summation module to generate a third signal that controls a frequency of a third clock signal being outputted by said another FOD.

8. A system comprising:
   a first set of transceivers configured to receive input data and output a plurality of reference clock signals;
   a second set of transceivers configured to receive a plurality of output clock signals and output a set of synchronized data; and
   a timing circuit comprising at least an analog phase lock loop (APLL), a plurality of digital phase lock loops (DPLLs) and a plurality of fractional output dividers (FODs), the timing circuit being configured to:
      receive the plurality of reference clock signals;
      use the plurality of reference clock signals, a feedback fractional frequency offset signal, and feedback of at least one of a plurality of output clock signals to generate at least one fractional frequency offset signal, wherein the feedback fractional frequency offset signal is variable;
      apply at least one operand on the at least one fractional frequency offset signal;
      sum results of the application of the at least one operand on the at least one fractional frequency offset signal to generate a plurality of signals that control frequencies of the plurality of output clock signals; and
      send the plurality of signals to the second set of transceivers.

9. The system of claim 8, wherein the timing circuit is further configured to:
   apply the at least one operand on a feedback fractional frequency offset signal; and
   sum a result of the application of the at least one operand on the feedback fractional frequency offset signal with the sum of the results of the application of the at least one operand on the at least one fractional frequency offset signal to generate the plurality of signals.

10. The system of claim 8, wherein the timing circuit is configured to:
    multiply the feedback fractional frequency offset signal with the feedback of at least one of the plurality of output clock signals to generate the at least one fractional frequency offset signal.

11. The system of claim 8, wherein the at least one operand comprises:
    an addition operand;
    a subtraction operand; and
    a block operand.

12. The system of claim 8, wherein:
    the plurality of DPLLs comprises enabled DPLLs and disabled DPLLs;
    fractional frequency offset signals generated by the disabled DPLLs are inaccessible; and
    the application of the at least one operand on the at least one fractional frequency offset signal comprises application of the at least one operand on fractional frequency offset signals generated by the enabled DPLLs.

13. The system of claim 8, wherein the timing circuit is configured to:
    hold the plurality of signals at a constant voltage levels;
    receive an update to the at least one operand;
    apply the at least one updated operand on the at least one fractional frequency offset signal; and
    release the hold of the plurality of signals.

14. The system of claim 8, wherein the timing circuit comprises a plurality of summation modules configured to apply the at least one operand on the at least one fractional frequency offset signal and sum the results of the application of the at least one operand on the at least one fractional frequency offset signal to generate the plurality of signals.

15. A method for operating a timing circuit, the method comprising:
    receiving a plurality of reference clock signals;
    using the plurality of reference clock signals, a feedback fractional frequency offset signal, and feedback of at least one of the plurality of output clock signals to generate at least one fractional frequency offset signal, wherein the feedback fractional frequency offset signal is variable;
    applying at least one operand on the at least one fractional frequency offset signal; and
    determining a sum of results of the application of the at least one operand on the at least one fractional frequency offset signal to generate a plurality of signals that control frequencies of a plurality of output clock signals that are synchronized with the plurality of reference clock signals.

16. The method of claim 15, further comprising:
    applying the at least one operand on a feedback fractional frequency offset signal; and
    determining a sum of a result of the application of the at least one operand on the feedback fractional frequency offset signal with the sum of the results of the application of the at least one operand on the at least one fractional frequency offset signal to generate the plurality of signals.

17. The method of claim 15, further comprising:
multiplying the feedback fractional frequency offset signal with the feedback of at least one of the plurality of output clock signals to generate the at least one fractional frequency offset signal.

18. The method of claim 15, wherein the at least one operand comprises:
an addition operand;
a subtraction operand; and
a block operand.

19. The method of claim 15, wherein applying the at least one operand on the at least one fractional frequency offset signal comprises applying the at least one operand on fractional frequency offset signals generated by a set of digital phase lock loops (DPLLs) that are enabled in a timing circuit.

20. The method of claim 15, further comprising:
holding the plurality of signals at a constant voltage levels;
receiving an update to the at least one operand;
applying the at least one updated operand on the at least one fractional frequency offset signal; and
releasing the hold of the plurality of signals.

* * * * *